United States Patent
Zhou

(10) Patent No.: US 9,190,317 B2
(45) Date of Patent: Nov. 17, 2015

(54) INTERCONNECTION STRUCTURES AND FABRICATION METHOD THEREOF

(71) Applicant: Semiconductor Manufacturing International (Shanghai) Corporation, Shanghai (CN)

(72) Inventor: Ming Zhou, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 105 days.

(21) Appl. No.: 14/020,795

(22) Filed: Sep. 7, 2013

(65) Prior Publication Data

US 2014/0191411 A1    Jul. 10, 2014

(30) Foreign Application Priority Data

Jan. 10, 2013   (CN) .............. 2013 1 000960

(51) Int. Cl.

| H01L 21/768 | (2006.01) |
|---|---|
| H01L 23/48 | (2006.01) |
| H01L 21/02 | (2006.01) |
| H01L 21/027 | (2006.01) |
| H01L 21/311 | (2006.01) |

(52) U.S. Cl.
CPC ...... *H01L 21/76802* (2013.01); *H01L 21/0214* (2013.01); *H01L 21/0276* (2013.01); *H01L 21/02271* (2013.01); *H01L 21/31144* (2013.01); *H01L 2221/1047* (2013.01); *H01L 2924/0002* (2013.01)

(58) Field of Classification Search
CPC . H01L 21/768; H01L 23/48; H01L 21/76802; H01L 23/481; H01L 23/5226; H01L 21/76877
USPC ......... 438/629, 672, 675, 627, 637, 643, 653, 438/671, 636, 72, 48; 257/774
See application file for complete search history.

(56) References Cited

U.S. PATENT DOCUMENTS

| 6,821,896 B1 * | 11/2004 | Shih .............................. 438/692 |
|---|---|---|
| 7,279,427 B2 | 10/2007 | Nishino et al. |
| 2005/0186801 A1 * | 8/2005 | Uno et al. ..................... 438/706 |
| 2006/0019491 A1 * | 1/2006 | Soda ............................ 438/638 |
| 2006/0183317 A1 * | 8/2006 | Noguchi et al. .............. 438/629 |
| 2012/0146220 A1 * | 6/2012 | Sasajima et al. ............. 257/741 |

* cited by examiner

*Primary Examiner* — Chuong A Luu
(74) *Attorney, Agent, or Firm* — Anova Law Group, PLLC

(57) ABSTRACT

A method is provided for fabricating an interconnection structure. The method includes providing a substrate having certain semiconductor devices, a metal layer electrically connecting with the semiconductor devices, and a barrier layer on the metal layer. The method also includes forming a dielectric layer on the substrate; and forming an antireflective coating on the dielectric layer. Further, the method includes forming a second mask having a first pattern corresponding to a through hole in the dielectric layer, wherein the antireflective coating significantly reduces lithographic light reflection to avoid photoresist residue in the first pattern; and forming a through hole by etching the dielectric layer and the antireflective coating covering the dielectric layer using the second mask as an etching mask. Further, the method also includes forming a via by filling the through hole with a conductive material.

16 Claims, 5 Drawing Sheets

_US 9,190,317 B2_

INTERCONNECTION STRUCTURES AND FABRICATION METHOD THEREOF

CROSS-REFERENCES TO RELATED APPLICATIONS

This application claims the priority of Chinese patent application No. 20131000960.0, filed on Jan. 10, 2013, the entirety of which is incorporated herein by reference.

FIELD OF THE INVENTION

The present invention generally relates to the field of semiconductor manufacturing technology and, more particularly, relates to interconnection structures and fabrication techniques thereof.

BACKGROUND

A current challenge of the field of integrated circuit (IC) design and manufacturing is how to reduce resistive capacitive delays of signal transmissions. A plurality of methods have been developed. One is substituting aluminum metal layers with copper metal layers to reduce serial resistances between the metal layers. Another is reducing parasite capacitances between metal layers, which may be achieved by forming porous low dielectric constant (low-K) materials or air gaps in dielectric layers between the metal layers.

FIG. 1 illustrates an excising interconnection structure. The interconnection structure includes: a substrate 5 having semiconductor devices (not shown) inside; a low-K dielectric layer 4 on the semiconductor substrate 5; a mask layer 6 on the low-K dielectric layer 4; through holes (not shown) formed by patterning the low-K dielectric layer 4 through the mask layer 6; and connection vias (not shown) electrically connected with the semiconductor devices formed by filling the through holes with metal materials.

However, a via miss defect may be easily formed when the low-K dielectric layer 4 is patterned using the mask layer 6 as a patterning mask. The via miss defect may refer to the structure where the vias are not able to completely penetrate through the low-K dielectric layer 4, or even worse, no via is formed.

The via miss defect may affect a yield of the interconnection structure, and may also affect the reliability of an electrical connection of the interconnection structure. The disclosed methods and systems are directed to solve one or more problems set forth above and other problems.

BRIEF SUMMARY OF THE DISCLOSURE

One aspect of the present disclosure includes a method for fabricating an interconnection structure. The method includes providing a substrate having certain semiconductor devices, a metal layer electrically connecting with the semiconductor devices, and a barrier layer on the metal layer. The method also includes forming a dielectric layer on the substrate; and forming an antireflective coating on the dielectric layer. Further, the method includes forming a second mask having a pattern corresponding to a through hole, wherein the antireflective coating significantly reduces lithographic light reflection to avoid photoresist residue in the pattern corresponding to the through hole; and forming a through hole by etching the dielectric layer and the antireflective coating covering the dielectric layer using the second mask as an etching mask. Further, the method also includes forming a via by filling the through hole using a conductive material.

Another aspect of the present disclosure includes an interconnection structure. The interconnection structure includes a substrate having certain semiconductor devices. The interconnection structure also includes a porous dielectric layer on the substrate. Further, the interconnection structure also includes a via electrically connected with the semiconductor devices in the substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

One reason causing the via miss defect may be residue mask materials. During a photolithography process, excessive mask materials, such as photoresist, may remain in through holes. The residue mask materials may affect the formation of vias in the through holes.

Figure 1:
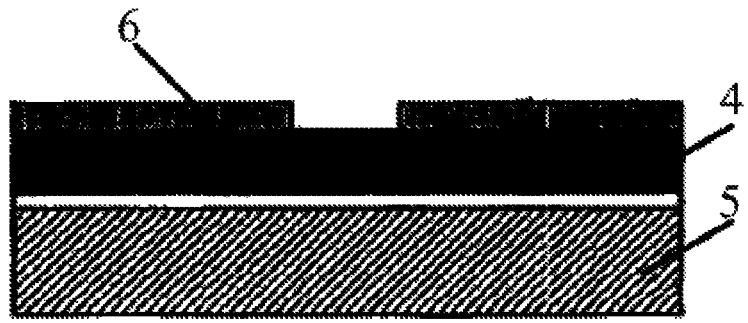
FIG. 1 illustrates an existing interconnection structure.
Figure 2:
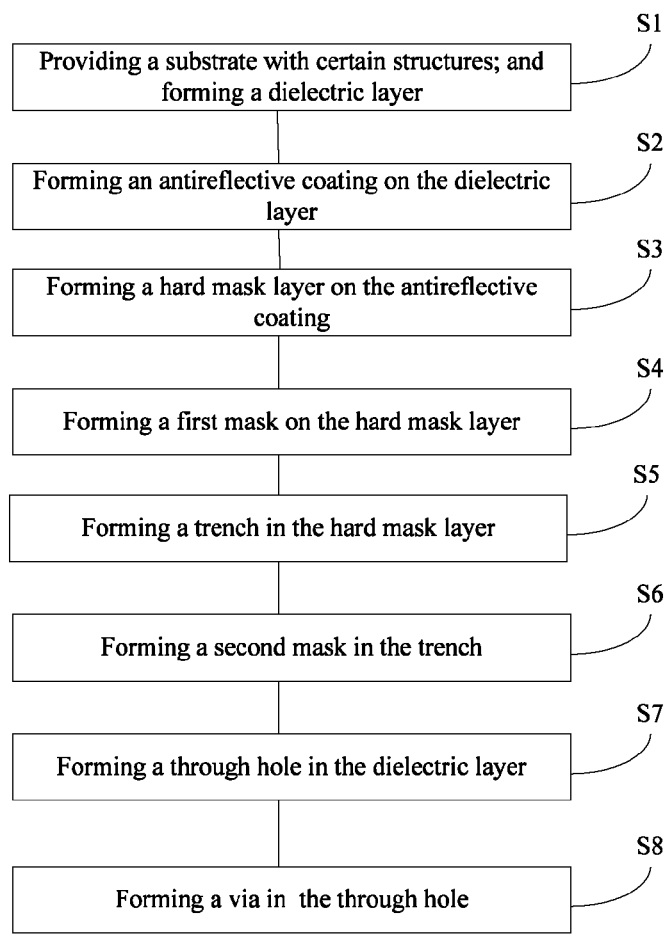
FIG. 2 illustrates an exemplary fabrication process for an interconnection structure consistent with the disclosed embodiments.

FIG. 2 illustrates an exemplary fabrication process for an interconnection structure consistent with the disclosed embodiments; and FIGS. 3-10 illustrate semiconductor structures corresponding to certain stages of the exemplary fabrication process.

Figure 3:
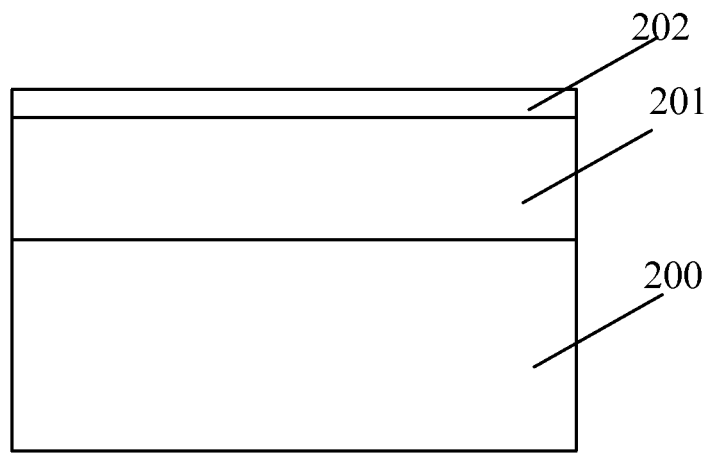
FIGS. 3-10 illustrate semiconductor structures corresponding to certain stages of an exemplary fabrication process for an interconnection structure consistent with the disclosed embodiments.

As shown in FIG. 2, at the beginning of the fabrication process, a substrate with certain structures is provided (S1). FIG. 3 illustrates a corresponding semiconductor structure.

As shown in FIG. 3, a substrate 200 is provided. The substrate 200 may have a substrate layer (not shown), a metal layer (not shown) on the substrate layer, and a barrier layer (not shown) on the metal layer. Certain semiconductor devices (not shown) may be formed inside and/or on top of the substrate layer.

The semiconductor device may be one or more of MOS transistor, diode, memory, capacitor, resistor, inductor and MEMS, etc. The substrate layer may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials, or silicon on insulator (SOI), etc.

The metal layer may be used to electrically connect the semiconductor devices in the substrate layer with other devices or structures through subsequently formed interconnection structures. The metal layer may be made of any appropriate metal material, such as copper, gold, silver, aluminum, or titanium, etc. In one embodiment, the metal layer is made of copper or aluminum. Various processes may be used to form the metal layer, such as a physical vapor deposition (PVD) process including a sputter coating process, or a thermal evaporation process, etc. The metal layer may also be formed by a chemical vapor deposition (CVD) process, or an electroplating process, etc.

The barrier layer may be used to prevent metal in the metal layer from diffusing. The barrier layer may be made of any appropriate material, such as silicon oxide, silicon nitride, silicon oxynitride, aluminum oxide, or nitrogen doped silicon carbide, etc. In one embodiment, the barrier layer is made of nitrogen doped silicon carbide (NDC). Various processes may be used to form the barrier layer, such as a PVD process, a CVD process, or an atomic layer deposition process, etc.

Further, as shown in FIG. 3, after forming the barrier layer, a dielectric layer 201 may be formed on the substrate 200. The dielectric layer 201 may be made of any appropriate material, such as silicon oxide, silicon nitride, silicon oxynitride, etc. The dielectric material layer 201 may also be made of one or more of SiCOH, SiCO, SiCON, or black diamond, etc.

The dielectric layer 201 may be any appropriate form, such as a dense layer, or a porous layer, etc. In one embodiment, the dielectric layer 201 is a porous dielectric layer, that is, a low-K dielectric layer. For illustrative purposes, a porous dielectric layer 201 may be used throughout the entire disclosure. In certain other embodiments, the dielectric layer 201 may also be a dielectric layer with a normal dielectric constant, or an ultra-low dielectric constant.

The porous dielectric layer 201 may be formed by various processes. For example, the porous dielectric layer 201 may be formed by forming a dielectric material layer on the substrate 200, followed by an ultraviolet light treatment process to form pores in the dielectric material layer. Various processes may be used to form the dielectric material layer, such as a CVD process, a PVD process, or a sol-gel and spin-coating process, etc. In one embodiment, the dielectric material layer is formed by a sol-gel and spin coating process. Diemethyldiethoxysilane may be used as a precursor; an atom transfer radical polymerization (ATRP) method may be used to form a coating material (i.e. sol-gel precursor made of methyldiethoxysilane). The coating material may be deposited on the substrate 200 by a spin-coating process to form the dielectric material layer. After the spin-coating process, an ultraviolet light treatment process, and/or a heat treatment process may be performed on the dielectric material layer to form a porous structure, or other appropriate structures. Thus the porous dielectric layer 201 is formed.

Optionally and/or additionally, a black diamond (BD) hard mask layer 202 may be formed on the porous dielectric layer 201. A hard mask may refer to a material used in semiconductor processing as an etch mask in lieu of polymer or other organic "soft" resist materials. The BD hard mask layer 202 may be used to form hard mask patterns. The porous dielectric layer 201 may be relatively thick, when hard mask patterns are used to pattern the porous dielectric layer 201, better patterns may be obtained. In certain other embodiments, the BD hard mask layer 202 may be omitted.

Figure 4:
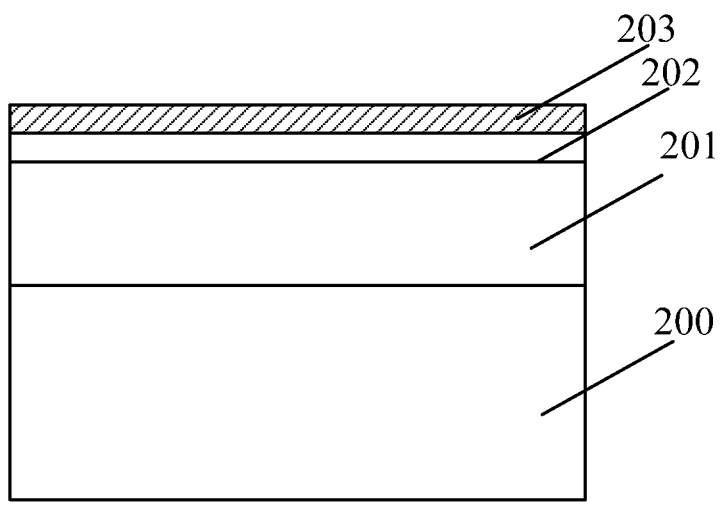

Returning to FIG. 2, after forming the porous dielectric layer 201, an antireflective coating (ARC) may be formed (S2). FIG. 4 illustrates a corresponding semiconductor structure.

As shown in FIG. 4, an ARC 203 is formed. The ARC 203 may be formed on the porous dielectric layer 201 directly if the BD hard mask layer 202 is omitted. If the BD hard mask layer 202 is used, the ARC 203 is formed on the BD hard mask layer 202.

The ARC 203 may be made of any appropriate material, such as silicon oxide, silicon nitride, or silicon oxynitride, etc. The ARC 203 may also be an organic ARC. In one embodiment, the ARC 203 is a silicon oxynitride (SiON) layer. For illustrative purposes, a SiON ARC 203 may be used throughout the entire description to refer to the ARC 203.

Various methods may be used to form the SiON ARC 203. In one embodiment the SiON ARC 203 is formed by a reaction of diemethyldiethoxysilane, oxygen-containing gas and nitrogen-containing gas. The oxygen (or nitrogen)-containing gas may refer to a gas containing oxygen (or nitrogen) element. In one embodiment, the SiON ARC 203 may be formed by the reaction of diemethyldiethoxysilane, oxygen and hydrazine ($N_2H_4$). In certain other embodiments, the SiON ARC 203 may be formed the reaction of diemethyldiethoxysilane, oxygen and ammonia. Other appropriate gas source may also be used to form the SiON ARC 203. For example, the oxygen-containing gas may be ozone.

The reaction of diemethyldiethoxysilane, oxygen-containing gas and nitrogen-containing gas may be achieved by any appropriate process, such as a CVD process, a laser decomposition process, or a thermal decomposition process, etc. In one embodiment, the reaction of diemethyldiethoxysilane, oxygen and $N_2H_4$ for forming the SiON ARC 203 is achieved by a CVD process. A chamber pressure of the CVD process may be in a range of approximately 0.1 Torr~7 Torr. Specifically, a flow of diemethyldiethoxysilane may be in a range of approximately 100 sccm~1000 sccm; a flow of $N_2H_4$ may be in a range of approximately 100 sccm~1000 sccm; and a flow of oxygen may be in a range of approximately 100 sccm~1000 sccm.

A thickness of the SiON ARC 203 may affect certain aspects of the method for forming an interconnection structure. If the thickness of the SiON ARC 203 is significantly big, it may be easy to waste material. If the thickness of the SiON ARC 203 is substantially small, an antireflective effect of the SiON ARC 203 may be unobvious. In one embodiment, the thickness of the SiON ARC 203 may be in a range of approximately 5 nm~50 nm.

Figure 5:
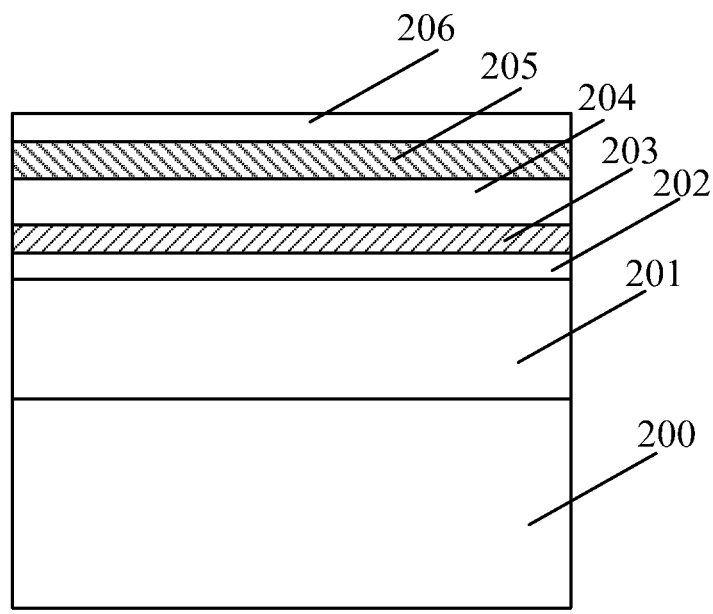

Returning to FIG. 2, after forming the SiON ARC 203, a hard mask layer may be formed on the SiON ARC 203 (S3). FIG. 5 illustrates a corresponding semiconductor structure.

As shown in FIG. 5, a hard mask layer sequentially having a tetraethylorthosilicate (TEOS) hard mask 204, a metal hard mask 205 and an oxide layer 206 is formed on the SiON ARC 203. The TEOS hard mask 204 may also be other material. The TEOS hard mask 204 may be formed by any appropriate process, such as a PVD process, or a spin-coating process etc. The metal hard mask 205 may be made of any appropriate metal, such as copper, aluminum, or gold, etc. The metal hard mask 205 may be formed by any appropriate process, such as a CVD process, a PVD process, or an electroplating process, etc. The oxide layer 206 may be a silicon oxide layer, an aluminum oxide layer, or a silicon oxynitride layer, etc. Various processes may be used to form the oxide layer 206, such as a CVD process, a PVD process, or an atomic layer deposition process, etc.

The hard mask layer may be a multiple layer structure with a plurality of layers made of different materials. The hard mask layer may also be a single layer.

Figure 6:
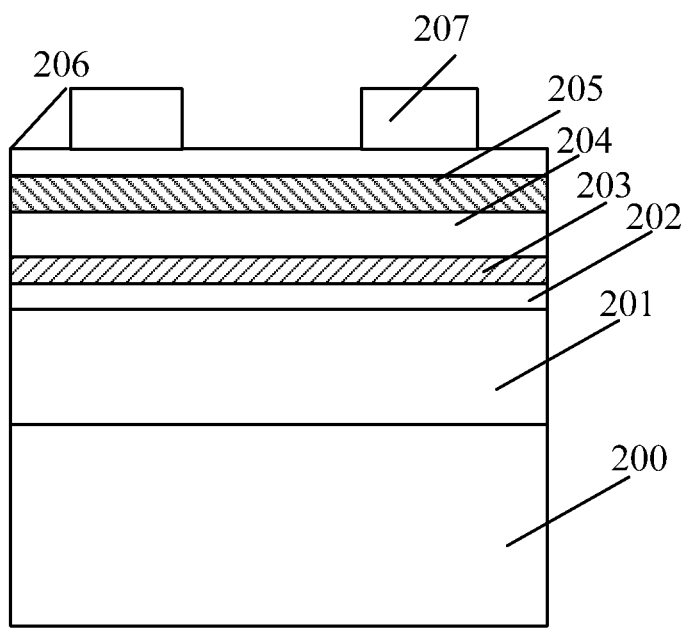

Returning to FIG. 2, after forming the hard mask layer, a first mask may be formed on the hard mask layer (S4). FIG. 6 illustrates a corresponding semiconductor structure.

As shown in FIG. 6, a first mask 207 is formed on the oxide layer 206 of the hard mask layer. The first mask 207 may be a hard mask, or a photoresist mask. In one embodiment, the first mask 207 is a photoresist mask. For illustrative purposes, a first photoresist mask 207 may be used to refer to the first mask 207 throughout the entire description.

The first photoresist mask 207 may be patterned to form patterns of subsequently formed trenches. A photolithography process may be used to pattern the first photoresist mask 207.

Figure 7:
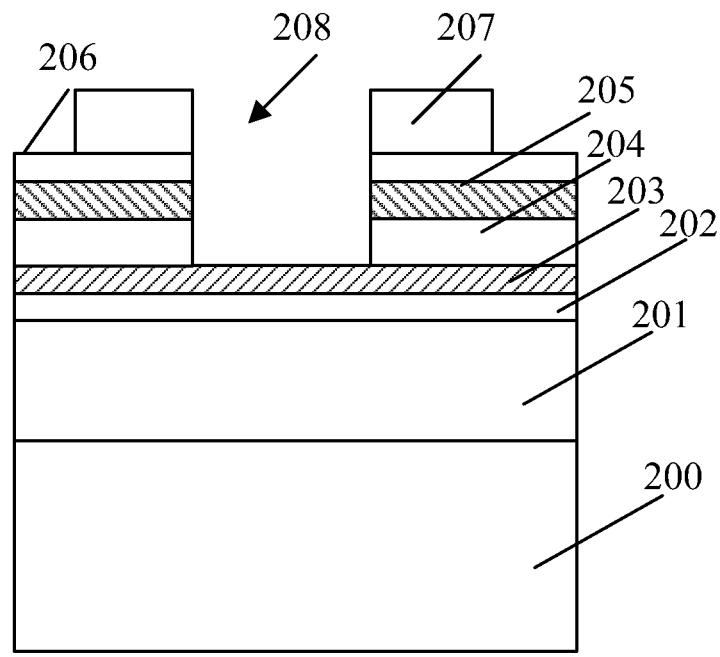

Returning to FIG. 2, after forming the first photoresist mask 207 with certain patterns, a trench may be formed in the hard mask layer (S5). FIG. 7 illustrates a corresponding semiconductor structure.

As shown in FIG. 7, a trench 208 is formed in the hard mask. The trench 208 may be formed by etching the oxide layer 206, the metal hard mask 205, and the TEOS hard mask 204 using the first photoresist mask 207 as an etching mask. A process for etching the oxide layer 206, the metal hard mask 205 and the TEOS hard mask 204 may be one or more of a plasma etching process, an ion beam etching process, and a wet chemical etching process. The etching process may be stopped when the SiON ARC 202 is exposed.

Figure 8:
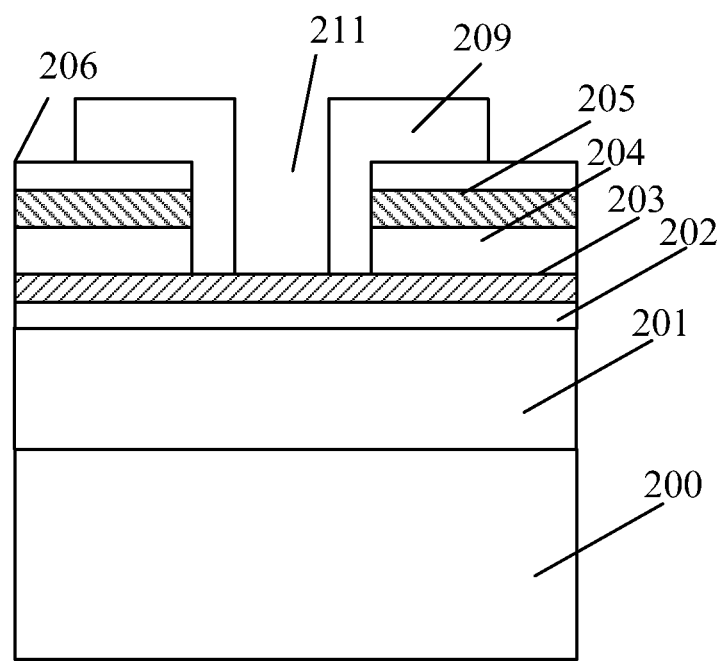

Returning to FIG. 2, after forming the trench 208, a second mask may be formed in the trench 208 (S6). FIG. 8 illustrates a corresponding semiconductor structure.

As shown in FIG. 8, a second mask 209 is formed in the trench 208. The second mask may be patterned to form a first pattern 211 for subsequently forming a through hole. The second mask 209 may be a hard mask, or a photoresist mask. In one embodiment, the second mask 209 is a photoresist mask. For illustrative purposes, a second photoresist mask 209 may be used to refer to the second mask 209 throughout the entire description.

The first pattern 211 for subsequently forming a through hole may be formed by a photolithography process. Since the second photoresist mask 209 may occupy a portion of the trench 208, an opening of the first pattern 211 may be relatively small, thus a portion of the SiON ARC 203 exposed by the first pattern 211 may also be relatively small.

Figure 9:
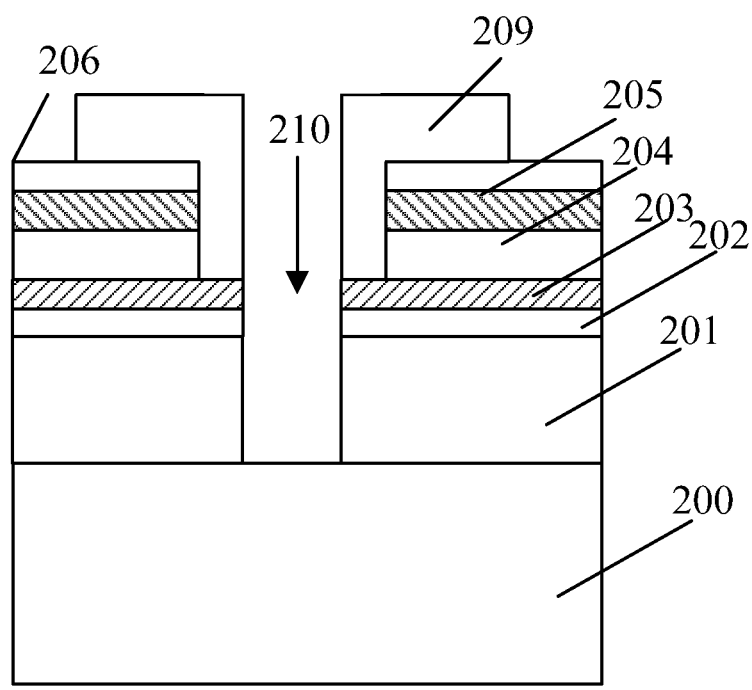

Returning to FIG. 2, after forming the second photoresist mask 209, a through hole may be formed in the porous dielectric layer 201 (S7). FIG. 9 illustrates a corresponding semiconductor structure.

As shown in FIG. 9, a through hole 210 completely penetrating through the porous dielectric layer 201 is formed. The through hole 210 may also penetrate through the SiON ARC 203, and the BD hard mask 202 if the BD hard mask 202 is used.

The through hole 210 may be formed by sequentially etching a portion of the SiON ARC 203, a portion of the BD hard mask 202 and a portion of the porous dielectric 201 exposed by the first pattern 211 in the second photoresist mask 209. The SiON ARC 203 may have an antireflective effect during the photolithography process for forming the first pattern 211, a photoresist residue issue of the second photoresist mask 209 caused by a reflective light may be prevented. Because the SiON ARC 203 may eliminate a standing wave effect caused by a light reflection from the substrate 200. The standing wave effect may cause the second photoresist mask 209 not to be completely developed, that is, the first pattern 211 in the second photoresist mask 209 may be partially completed. For example, the sidewall of the first pattern 211 may be significantly rough, or even worse, the first pattern 211 of the second photoresist mask 209 may be blocked (may refer as a photoresis residue issue). When the porous dielectric 201 is etched using the second photoresist mask 209 as an etching mask, etching ions or chemical may be unable to reach the surface of the porous dielectric 201, a complete through hole 210 may be unable to be formed, and/or no through hole 210 may be unable to be formed. If the SiON ARC 203 is used, the sidewall of the first pattern 211 of the second photoresist mask 209 may be smooth. Thus, it may ensure the through hole 210 to completely penetrate through the porous dielectric layer 201 after an etching process, and a yield of the method for forming the interconnection structure may be enhanced.

The portion of the SiON ARC 203, the portion of the BD hard mask 202 and the portion of the porous dielectric 201 may be etched by any appropriate process, such as a wet chemical etching process, or a dry etching process etc. In one embodiment, a wet etching process is used to etch the portion of the BD hard mask 202 and the portion of the porous dielectric 201 to form the through hole 210. A diluted hydrogen fluoride solution may be used for the wet etching process. Other appropriate chemical may also be used for the wet etching process.

Figure 10:
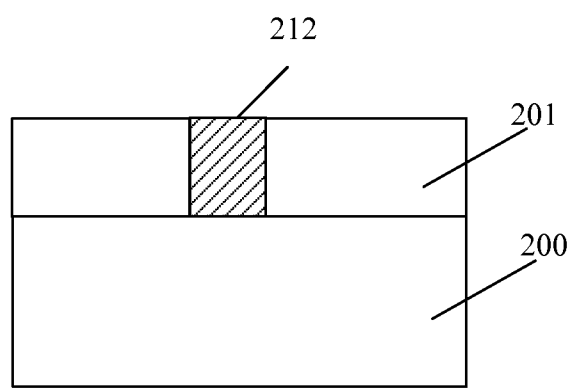

Returning to FIG. 2, after forming through hole 210, a via may be formed in the through hole 210 (S8). FIG. 10 illustrates a corresponding semiconductor structure.

As shown in FIG. 10, a via 212 is formed in the through hole 210. The via 212 is used to electrically connect the metal layer in the substrate 200 with other devices and/or structures.

The via 212 may be formed by filling a conductive material into the through hole 210. The conductive material may include any appropriate metal, such as W, Al, Cu, Ti, Ta, TaN, NiSi, CoSi, TiN, TiAl or TaSiN, etc. The via 212 may be formed by any appropriate process, such as a CVD process, a PVD process, a flowable CVD process, or an electroplating process, etc. Since the photoresist residue issue may be solved by forming the SiON ARC 203, photoresist residues may be unlikely found in the through hole 210, the via 212 may have a desired quality after filling the conductive material into the through hole 210. Thus, a yield of the interconnection structure may be enhanced.

Further, after forming the via 212, a chemical mechanical polishing (CMP) process may be performed to remove excessive conductive material from the process for forming the via 212. The CMP process may also be used to remove the TEOS hard mask 204, the metal hard mask 205, the oxide layer 206, the SiON ARC 203, and the BD hard mask 202. Thus, the porous dielectric layer 201 and the via 212 may be exposed after the CMP process. The via 212 may be used to electrically connect the metal layer of the substrate 200 with other devices and/or structures, thus the semiconductor devices in the substrate 200 may be electrically connected with the other devices and/or structures.

In certain other embodiments, the trench 208 may unnecessarily be formed, the through hole 210 may be formed directly, followed by forming the via 212. Thus, the interconnection structure may be formed.

Thus, an interconnection structure may be formed by the above disclosed processes and methods, a corresponding interconnection structure is illustrated in FIG. 10. The interconnection structure includes a substrate 200 having certain semiconductor devices inside. The interconnection structure also includes a porous dielectric layer 201 on the substrate 200. Further, the interconnection structure also includes a via 212 electrically connected with the semiconductor devices in the substrate 200. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an interconnection structure, comprising:
   providing a substrate having certain semiconductor devices, a metal layer electrically connecting with the semiconductor devices, and a barrier layer on the metal layer;
   forming a dielectric layer on the substrate;
   forming a black diamond hard mask on the dielectric layer;
   forming an antireflective coating made of silicon oxynitride (SiON) on the black diamond hard mask that is on the dielectric layer;
   forming a second mask having a first pattern corresponding to a through hole, wherein the antireflective coating significantly reduces lithographic light reflection to avoid photoresist residue in the first pattern;
   forming a through hole by etching the dielectric layer and the antireflective coating covering the dielectric layer using the second mask as an etching mask; and
   forming a via by filling the through hole with a conductive material.

2. The method according to claim 1, wherein:
   the dielectric layer is a porous dielectric layer; and
   the second mask is a photoresist mask.

3. The method according to claim 1, after forming antireflective coating and before forming the second mask, further including:
   forming a hard mask layer on the antireflective layer;
   forming a first mask over the hard mask layer; and
   forming a first trench through the hard mask layer and on the antireflective layer, using the first mask as an etch mask.

4. The method according to claim 3, wherein:
   the hard mask layer includes a tetraethylorthosilicate (TEOS) hard mask on the antireflective coating.

5. The method according to claim 3, wherein:
   the first mask is a photo resist mask.

6. The method according to claim 3, wherein:
   the first trench is formed by etching the hard mask layer until the antireflective coating is exposed.

7. The method according to claim 3, further comprising:
   removing the first mask, and
   forming the second mask on sidewalls of the first trench and over a surface portion of the hard mask layer.

8. The method according to claim 3, wherein:
   the hard mask layer further includes a metal mask formed thereon and an oxide layer formed on the metal mask.

9. The method according to claim 8, wherein:
   the through hole or the via is formed having a sidewall formed by the dielectric layer, the black diamond hard mask layer, the antireflective coating, and the second mask, and
   the second mask is formed on the antireflective coating and on a sidewall formed by the hard mask, the metal mask, and the oxide layer.

10. The method according to claim 1, wherein:
    a thickness of the antireflective coating is in a range of approximately 5 nm-about 50 nm.

11. The method according to claim 1, wherein:
    the SiON antireflective coating is formed by a reaction of diemethyldiethoxysilane, oxygen and hydrazine ($N_2H_4$), or a reaction of diemethyldiethoxysilane, oxygen and ammonia ($NH_3$).

12. The method according to claim 11, wherein:
    a chemical vapor deposition process is used to achieve the reaction of diemethyldiethoxysilane, oxygen and hydrazine ($N_2H_4$), or the reaction of diemethyldiethoxysilane, oxygen and ammonia ($NH_3$).

13. The method according to claim 12, wherein:
    a pressure of the chemical vapor deposition process is in a range of approximately 0.1 Torr-7 Torr;
    a flow of diemethyldiethoxysilane is in a range of approximately 100 sccm-1000 sccm;
    a flow of hydrazine is in a range of approximately 100 sccm-1000 sccm; and
    a flow of oxygen is in a range of approximately 100 sccm-1000 sccm.

14. The method according to claim 1, wherein:
    the dielectric layer is a low dielectric constant layer or an ultra-low dielectric layer.

15. The method according to claim 1, wherein:
    a wet chemical etching process is used to etch the dielectric layer.

16. The method according to claim 1, after forming the via, further including:
    performing a chemical mechanical polishing process to remove excessive conductive material, the second mask and the antireflective coating.

* * * * *

UNITED STATES PATENT AND TRADEMARK OFFICE
CERTIFICATE OF CORRECTION

| | | |
|---|---|---|
| PATENT NO. | : 9,190,317 B2 | Page 1 of 1 |
| APPLICATION NO. | : 14/020795 | |
| DATED | : November 17, 2015 | |
| INVENTOR(S) | : Ming Zhou | |

It is certified that error appears in the above-identified patent and that said Letters Patent is hereby corrected as shown below:

Title Page, should read,

(30)      Foreign Application Priority Data

Jan. 10, 2013    (CN) ...................... 2013 1 0009260

Signed and Sealed this
Sixteenth Day of August, 2016

Michelle K. Lee
*Director of the United States Patent and Trademark Office*